United States Patent [19]

Kusakabe

[11] 4,268,916
[45] May 19, 1981

[54] FREQUENCY CONVERTING CIRCUIT
[75] Inventor: Hiromi Kusakabe, Yokohama, Japan
[73] Assignee: Tokyo Shibaura Denki Kabushiki Kaisha, Kawasaki, Japan
[21] Appl. No.: 961,026
[22] Filed: Nov. 13, 1978
[30] Foreign Application Priority Data
Nov. 28, 1977 [JP] Japan ................................ 52-142355
[51] Int. Cl.³ ............................................... H04B 1/26
[52] U.S. Cl. .................................... 455/333; 455/326; 328/15; 307/271
[58] Field of Search ............... 325/451, 318, 430, 434, 325/435, 438, 439, 442, 445, 446, 449, 450, 492; 307/260, 288, 289, 296 R, 297, 313; 332/1; 328/15, 19, 20; 363/163, 157, 173; 455/333, 331, 332, 313, 314, 319, 323, 343

[56] References Cited
U.S. PATENT DOCUMENTS

| | | | |
|---|---|---|---|
| 2,935,607 | 5/1960 | Koch | 325/451 |
| 3,302,118 | 1/1967 | Schoen | 325/451 |
| 3,491,301 | 1/1970 | Thompson | 325/451 |
| 3,555,303 | 1/1971 | Kozawa | 325/438 |
| 3,641,441 | 2/1972 | Gunn | 325/451 |
| 3,886,458 | 5/1975 | Matsumoto et al. | 325/439 |
| 3,949,306 | 4/1976 | Watanabe et al. | 325/451 |
| 4,058,771 | 11/1977 | Ohsawa | 325/451 |

OTHER PUBLICATIONS

Phase-Locked Integrated Ckt. by Grebene, et al., Nerem Record, 1969 (Nov.), pp. 86–87.

Primary Examiner—Robert L. Griffin
Assistant Examiner—Tommy P. Chin
Attorney, Agent, or Firm—Cushman, Darby & Cushman

[57] ABSTRACT

A frequency converting circuit is provided comprising a constant current source, an oscillation circuit including an amplifier so connected to the constant current source as to operate in the unsaturated operation region owing to the output current of the constant current source, an operation circuit which receives an input signal and the output signal from the oscillation circuit and produces an output signal corresponding to the product of both the received signals and a frequency converter for converting the frequency of the output signal of the operation circuit.

9 Claims, 5 Drawing Figures

FREQUENCY CONVERTING CIRCUIT

The invention relates to a frequency converting circuit.

Various frequency converting circuits used in receivers have been developed. One istance, as shown in FIG. 1, comprises: a doubly balanced type differential amplifier circuit including a differential amplifier stage, which is constructed by a couple of transistors TR1 and TR2, for receiving an input signal $V_g$ and a couple of differential amplifier stages having transistors TR3 to TR6; an oscillation circuit including a differential amplifier section constituted by transistors TR7 and TR8 and a tank circuit constituted by a coil L1 and a capacitor C1, and connected to apply an output signal to the bases of the transistors TR3 and TR6; and a tank circuit, which includes a coil L2 and a capacitor C2, connected between the collectors of the transistors TR4 and TR6 and a power source terminal $V_{cc}$. In this frequency converting circuit, the doubly balanced type differential amplifier circuit produces an output signal corresponding to the product of the input signal $V_g$ and the output signal of the oscillation circuit (the output signal has a frequency which is the sum or difference of or between the frequencies of both the received signals). The output signal of the doubly balanced differential amplifier circuit is frequency-converted by the tank circuit comprised of the components L2 and C2 and then is taken out from an output terminal $V_{out}$.

In the oscillation circuit, the differential amplifying circuit comprised of the transistors TR7 and TR8 amplifies the resonant signal from the tank circuit having the components L1, C1 and the amplified resonant signal is fed back to the tank circuit for effecting the oscillation. In this case, these transistors TR7 and TR8 are often operated in the saturated operation region. Therefore, the oscillating frequency would be restricted to a relatively low frequency. Further, when the frequency converting circuit is fabricated in the integrated circuit form, a parasitic pnp transistor is formed so that the oscillation signal is easily leaked to exterior, thus adversely affecting other circuits.

Accordingly, an object of the invention is to provide a frequency converting circuit with an oscillation circuit capable of producing a high frequency signal with a constant amplitude.

According to one embodiment of this invention, there is provided a frequency converting circuit comprising a constant current source circuit, an oscillation circuit including an amplifier section and a resonant section; means for biasing the amplifier section of the oscillating circuit thereby to cause the amplifier section to operate in the unsaturated operation region; and an operation circuit receiving the output signal from the oscillating circuit and an input signal to be converted and producing a signal corresponding to the product of both the received signals.

Other objects and features of the invention will be apparent from the following description taken in connection with the accompanying drawings, in which.

Figure 2:
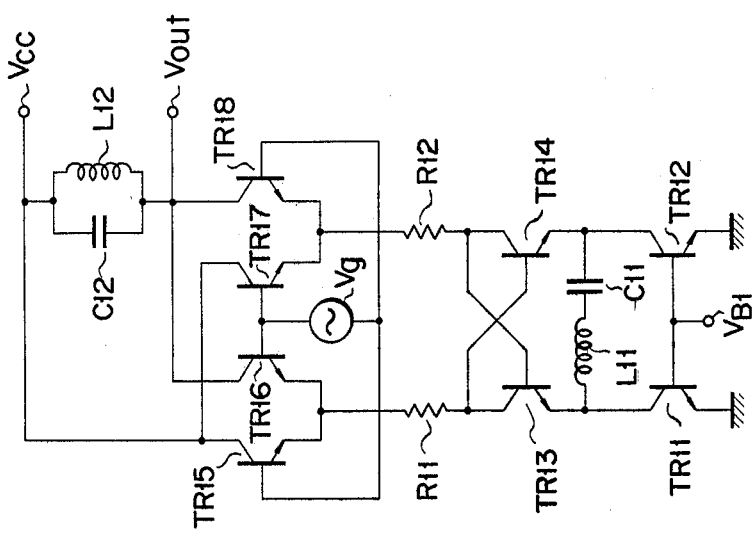
FIG. 2 shows a circuit diagram of a frequency converting circuit according to one embodiment of this invention.
Figure 1:
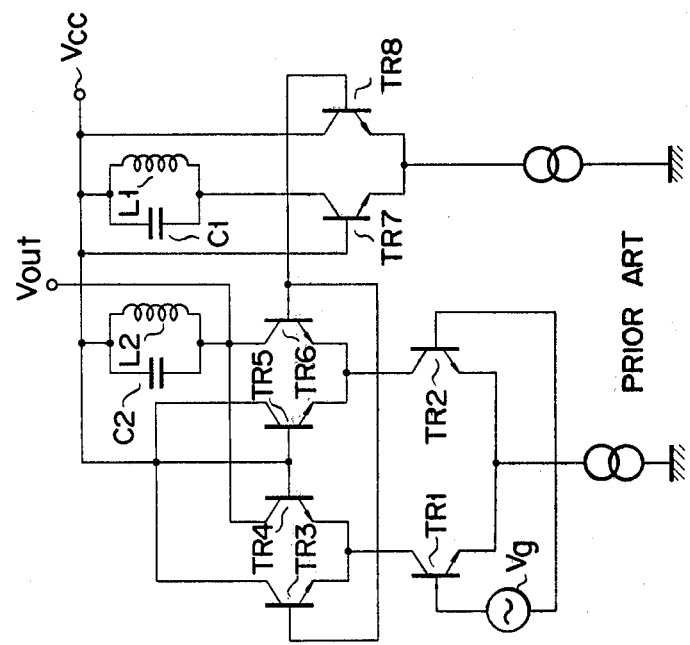
FIG. 1 is a circuit diagram of a conventional frequency converting circuit.

A frequency converting circuit according to the invention, which is shown in FIG. 2, is comprised of a constant current source including a couple of npn transistors TR11 and TR12 which are connected at the bases to a DC power source terminal $v_{B1}$ and an oscillation circuit including a series resonance circuit having a coil L11 and a capacitor C11, which is connected between the collectors of the transistors TR11 and TR12 and an amplifier section including a couple of npn transistors TR13 and TR14 which are connected at the emitters to the collectors of the transistors TR11 and TR12, respectively. The base and collector of the transistor TR13 are coupled with the collector and the base of the transistor TR14, respectively. The collectors of the transistors TR13 and TR14 are coupled in transmitting relation with the emitters of npn transistors TR15 and TR16 which form a first differential amplifier and the emitters of npn transistors TR17 and TR18 which form a second differential amplifier, through resistors R11 and R12, respectively. The bases of the transistors TR15 and TR18 are connected to one terminal of a signal source $V_g$ and the bases of the transistors TR16 and TR17, to the other terminal of the signal source $V_g$. The collectors of the transistors TR15 and TR17 are connected commonly to a power source terminal $V_{cc}$ while the collectors of the transistors TR16 and TR18 commonly to an output terminal $V_{out}$. The frequency converting circuit further includes a parallel resonance circuit, which is comprised of a coil L12 and C12, inserted between the power source terminal $V_{cc}$ and the output terminal $V_{out}$.

The explanation to follow is the operation of the frequency converting circuit shown in FIG. 2.

In operation, the transistors TR13 and TR14 are alternately rendered conductive, that is, those transistors have alternately the minimum value of resistance. The oscillator circuit constituted by transistors TR13 and TR14, coil L11 and capacitor C11, oscillates at the frequency, $$f = \frac{1}{2\pi \sqrt{L11\, C11}}.$$

Assume now that the transistor TR13 is rendered conductive. Then, the collector current of one transistor TR11 of the constant current source flows through the collector-emitter path of the transistor TR13 and the resistor R11 while the collector current of the other transistor TR12 transiently flows through a path including the series-resonance circuit having the components C11 and L11, transistor TR13 and resistors R11. Therefore, the current flowing through the resistor R11 is approximately two times the current through the transistor TR11 or TR12. Then, electric energy stored in the coil L11 and capacitor C11 causes current to start flowing in the reverse direction so that the current flowing through the resistor R11 starts decreasing. Accordingly, the voltage drop across the resistor R11 becomes small while the base voltage of the transistor TR14 rises. As a consequence, the transistor TR14 is rendered conductive and the transistor TR13 is rendered nonconductive. Through the conduction of the transistor TR14, the current flowing through the resistor R12 becomes double the current of the transistor TR11 or TR12. In this manner, the oscillation circuit continues its oscillating operation. The output of the oscillator is applied through the resistor R11 and R12 to the first and second differential amplifier circuits. The first amplifier circuit receives at the emitters of the transistors TR15 and TR16 the oscillation signal from the oscillator and at the bases of the transistors TR15 and TR16 an output signal from the signal source $V_g$ and produces at the collector of the transistors TR15 and TR16 an output signal corresponding to the product of both the received signals. Similarly, transistors TR17 and TR18, constituting the second differential amplifier, receive at the emitters an output signal from the oscillator and at the bases an output signal from the signal source $v_g$ and produce at the collectors an output signal corresponding to the product of both the received signals. The output signals of those differential amplifier circuits are applied to the parallel tank circuit of the components L12 and C12 where they are converted into a signal with a given frequency, and the fixed frequency signal is taken out from the output terminal $V_{out}$.

It should be noted here that the current value fed from the constant current source and the voltage drops across the resistor R11 and R12 cause the transistors TR13 and TR14 to operate in the unsaturated operation region, that is, those values are so selected as to permit the transistors TR13 and TR14 to effect a current mode switching operation. For example, the resistance values of the resistors R11 and R12 are so selected that the peak-to-peak values of the collector output voltages of the transistors TR13 and TR14 are 150 to 300 mV.

Figure 3:
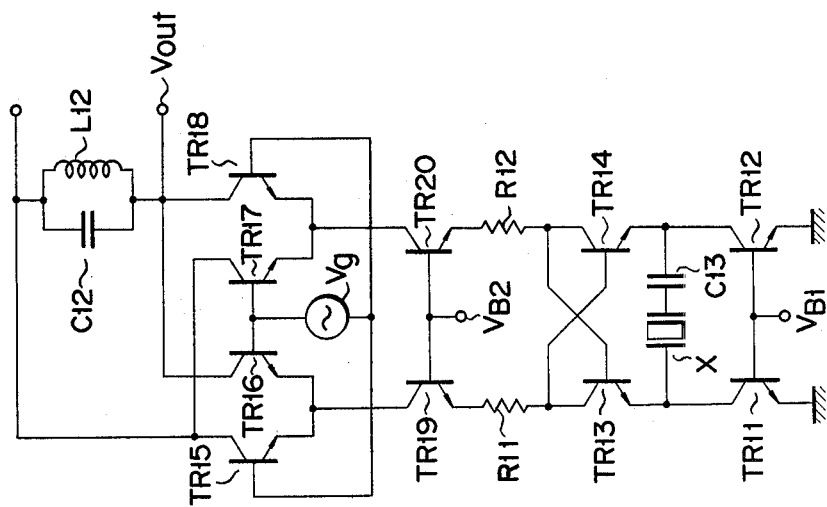

A frequency converting circuit shown in FIG. 3 is the same as the one in FIG. 2, except that a series resonance circuit including a crystal resonator X and a capacitor C13 is used in place of the resonance circuit of the components C11 and L11 and that buffer transistors TR19 and TR20 respectively are inserted between the resistors R11 and R12 and the first and second differential amplifiers. The transistor TR19 is connected at the collectors to the emitters of the transistors TR15 and TR16 and at the emitters to the resistor R11. The transistor TR20 is connected at the collector to the emitters of the transistors TR17 and TR18 and at the emitter to the resistor R12. Those transistors TR19 and TR20 are connected at the bases commonly to a bias source terminal $V_{B2}$.

Owing to the use of the transistors TR19 and TR20, the voltage variations at the emitters of the transistors TR15 and TR16 and of the transistors TR17 and TR18 due to the variation of the output signal from the source $V_g$ do not affect the base bias voltages of the transistors TR13 and TR14, through the resistors R11 and R12.

The use of the series-resonant circuit by the crystal resonator X and the capacitor C13 improves the accuracy of the oscillation frequency, compared with the FIG. 2 circuit.

Figure 4:
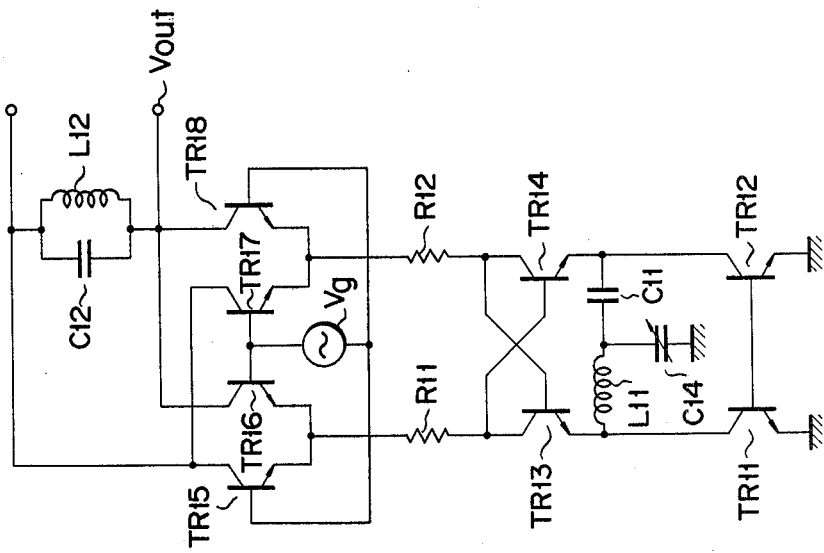
FIGS. 3 and 4 show circuit diagrams of frequency converting circuits according to other embodiments of this invention.

The feature of a frequency converting circuit in FIG. 4 resides in that a variable capacitor C14 is connected between the junction of the capacitor C11 and the coil L14 and ground. The oscillating frequency in the converter may be changed by adjusting the variable capacitor C14.

The frequency converting circuits thus far mentioned are well adapted for, for example, the frequency converter of a super heterodyne receiver, the second frequency converter in a double super-heterodyne receiver, a beat down circuit of the pulse count type or the phase locked loop type receiver, and the frequency offset circuit for a CB tranceiver.

Figure 5:
FIG. 5 shows a series-resonant circuit usable in place of the corresponding circuit used in the frequency converting circuit in FIG. 2.

While the invention has been described referring to some examples, the invention is not limited to such examples. For example, a combination of a crystal resonator or a ceramic resonator X and a capacitor C as shown in FIG. 5 may be used in place of the combination of the coil L11 and capacitor C11 in FIG. 2, resulting in improvement of the frequency accuracy of the oscillation signal. Further, in the FIG. 2 example, the coil L11 or capacitor C11 may be of variable type. Constant current elements such as resistors may also be used in place of the constant current source by the transistors TR11 and TR12. Switching elements such as MOS FETs, instead of bipolar transistors may be used for the differential amplifiers. The frequency converter in FIG. 3 may be modified such that, with omission of the transistors TR15 and TR16, the collector of the transistor TR19 is directly coupled with the power source terminal $V_{CC}$.

When the resultant emitter resistance of the transistors TR15 and TR16 and the transistors TR17 and TR18 may be set larger than the series resonant impedance of the components L11 and C11, resistors R11 and R12 are omissible.

What is claimed is:

1. A frequency converting circuit comprising:
   a constant current source circuit;
   an oscillation circuit coupling to said constant current source circuit, said oscillation circuit including an amplifier section and a series resonant section, said amplifier section including a first transistor having a base, collector and an emitter, said emitter connected to one end of said series-resonant circuit and a second transistor having an emitter connected to the other terminal of said series resonant circuit, a base connected to said first transistor collector and a collector connected to said first transistor base;
   means for biasing the amplifier section of said oscillation circuit in accordance with the output current of said constant current source circuit; and
   an operation circuit which receives the output signal from said oscillation circuit and an input signal to be frequency-converted and produces a signal corresponding to the product of both the received signals.

2. A frequency converting circuit according to claim 1, wherein said series resonant circuit is comprised of a coil and a capacitor.

3. A frequency converting circuit according to claim 1, wherein said series resonant circuit is comprised of a crystal resonator and a capacitor.

4. A frequency converting circuit according to claim 1, wherein said operation circuit includes a first differential amplifier having third and fourth transistors which are commonly connected at the emitters and receive between the bases the input signal to be frequency-converted and a second differential amplifier having fifth and sixth transistors which are commonly connected at the emitters and receive between the bases said input signal to be frequency-converted, and said biasing means includes a first resistor incerted between the emitters of said third and fourth transistors and the collector of said first transistor, and a second resistor inserted between the collector of said second transistor and the emitters of said fifth and sixth transistors.

5. A frequency converting circuit according to claim 1, in which said operation circuit includes a first differential amplifier having third and fourth transistors each having an emitter commonly connected to the collector of said first transistor and receive between the bases said input signal to be frequency-converted and a second differential amplifier having fifth and sixth transistors each having an emitter commonly connected to the collector of said second transistor and receive between the bases said input signal to be frequency-converted, and said bias means includes a resistor connected between said third and fourth transistors emitters and said first transistor collector and a resistor connected between said fifth and sixth transistors emitters and said second transistor collector.

6. A frequency converting circuit according to claim 1, wherein said operation circuit has a differential amplifier including third and fourth transistors each having an emitter commonly connected together and each having a base, said input signal to be frequency-converted being applied between said third and fourth transistor bases, and said bias means has first and second resistors which are connected at one end to the collectors of said first and second transistors and which further comprises a first buffer transistor having an emitter-collector path connected between the other end of said first resistor and the emitters of said third and fourth transistors and a second buffer transistor having an emitter-collector path connected at one end to the other end of said second resistor and a base connected to the base of said first buffer transistor.

7. A frequency converting circuit according to claim 6, wherein said operation circuit further comprises another differential amplifier including fifth and sixth transistors which are connected at the emitters commonly to the other end of the emitter-collector path of said second buffer transistor and receives said input signal to be frequency-converted between the bases.

8. A frequency converting circuit according to claim 4, 5, 6 or 7, which further comprises a resonance circuit connected to the output terminal of said operation circuit.

9. A frequency converting circuit according to claim 1, or 6, wherein said series-resonance circuit comprises a series circuit including a capacitor and a coil and a variable capacitor connected between the junction of said coil and capacitor and a reference power source terminal.

* * * * *